(12) United States Patent
Daniels et al.

(10) Patent No.: US 6,587,339 B1
(45) Date of Patent: Jul. 1, 2003

(54) PROTECTIVE POT OR CONTAINER

(75) Inventors: Fredrick Daniels, Floral City, FL (US); Christopher Kachurick, Plant City, FL (US)

(73) Assignee: Thornhurst Manufacturing, Inc., Zephyrhills, FL (US)

( * ) Notice: Subject to any disclaimer, the term of this patent is extended or adjusted under 35 U.S.C. 154(b) by 0 days.

(21) Appl. No.: 10/113,542

(22) Filed: Mar. 29, 2002

(51) Int. Cl.[7] .................................................. H05K 7/20
(52) U.S. Cl. ....................... 361/690; 361/719; 361/721; 455/128
(58) Field of Search ................................ 361/690, 692, 361/704, 707, 715, 1, 719, 796, 831; 174/52.1, 59; 165/80.3, 185; 454/184; 455/128

(56) References Cited

U.S. PATENT DOCUMENTS

| | | | | |
|---|---|---|---|---|
| 5,825,621 A | * | 10/1998 | Giannatto et al. | 361/701 |
| 5,896,268 A | * | 4/1999 | Beavers | 361/690 |
| 5,930,113 A | * | 7/1999 | McCann | 361/704 |
| 5,946,193 A | * | 8/1999 | Hendrix et al. | 361/704 |
| 6,065,530 A | * | 5/2000 | Austin et al. | 165/80.3 |
| 6,396,691 B1 | * | 5/2002 | Pagnozzi | 361/690 |
| 6,430,044 B2 | * | 8/2002 | Hutchinson et al. | 361/690 |

\* cited by examiner

*Primary Examiner*—Boris Chervinsky
(74) *Attorney, Agent, or Firm*—Arthur W. Fisher, III (57) ABSTRACT

A protective pot or container to protect electronic components disposed therein and to dissipate heat generated by operation of the electronic components comprising a cover assembly, a housing assembly and a base assembly to cooperatively form at least one electronic component compartment including a top opening and a bottom opening to operatively house the electronic components therein wherein the cover assembly comprises a lid removably attached to the housing assembly to selectively close the top opening, the housing assembly comprises an outer protective housing frame having a inner heat conductive sleeve partially disposed therein to absorb heat from the electronic components and at least one external heat sink in heat transfer relationship with the inner heat conductive sleeve to receive heat therefrom and to dissipate the heat into the surrounding environs and the base assembly comprising a base member and to selectively close the bottom opening.

20 Claims, 10 Drawing Sheets

PROTECTIVE POT OR CONTAINER

BACKGROUND OF THE INVENTION

1. Field of the Invention

A protective pot or container to protect electronic components disposed therein and to dissipate heat generated by operation of the electronic components.

2. Description of the Prior Art

With the increased demands for communications lines/links both above and underground, the need to boost transmission signals has occurred. As a result, additional electronic circuits and components have been introduced into the transmission systems. Since these electronic components need to be protected from the elements and environs, numerous protective shields or enclosures have been developed. The head generated by these electronic components confined by such enclosures have necessitated the development of efficient heat dissipating devices and techniques.

Unfortunately, many such systems are inefficient and therefore are of limited effectiveness, fail to adequately protect the sensitive electronic components or are simply too expensive for wide application and use. Thus, the need for an efficient, effective and relatively inexpensive protective device continues to exist.

SUMMARY OF THE INVENTION

The present invention relates to a protective pot or container comprising a cover assembly, a housing assembly and a base assembly to protect electronic components disposed therein from the environs and to dissipate heat generated by operation of the electronic components disposed therein into the environs.

The cover assembly selectively closes and seals the top of the housing assembly when attached to or mounted thereon.

The housing assembly comprises an outer protective housing frame including a plurality of walls with at least one inner heat conductive sleeve integrally formed therewith having an external heat sink operatively mounted to the housing assembly.

The inner heat conductive sleeve comprises a plurality of heat conductive panels including side members or walls and end members or walls of heat conductive material. The inner heat conductive sleeve and the outer protective housing frame are integrally formed by molding or pouring molten plastic or similar generally non-heat conductive material around the inner heat conductive sleeve such that the heat conductive panels are disposed in the interior of the outer protective housing frame with a heat conductive thermal coupler extending through the walls of the outer protective housing frame to the exterior of the outer protective housing frame to expose the outer surface of thermal coupler. The periphery of each heat conductive thermal coupler includes a mechanical anchor to form an integrated housing assembly with the outer protective frame. The exposed outer surface of the outer heat conductive thermal coupler is disposed in heat exchange relationship with a external heat sink.

The base assembly comprises a base member to secure or attach the base assembly to the housing assembly and a back plate attached to or mounted on the base member to support electronic components thereon and to selectively close the bottom of the housing assembly.

Each external heat sink constructed of thermally conductive material such as aluminum comprises a heat sink member disposed in heat transfer relationship with the outer heat conductive thermal coupler.

Thus, when the protective pot or container is fully assembled, heat generated by the electronic components disposed therein is transferred to the heat conductive panels and through the corresponding heat conductive thermal couplers to the corresponding external heat sinks and dissipated into the environs.

The invention accordingly comprises the features of construction, combination of elements, and arrangement of parts that will be exemplified in the construction hereinafter set forth, and the scope of the invention will be indicated in the claims.

BRIEF DESCRIPTION OF THE DRAWINGS

For a fuller understanding of the nature and object of the invention, reference should be had to the following detailed description taken in connection with the accompanying drawings in which.

Similar reference characters refer to similar parts throughout the several views of the drawings.

DETAILED DESCRIPTION OF THE PREFERRED EMBODIMENT

Figure 1:
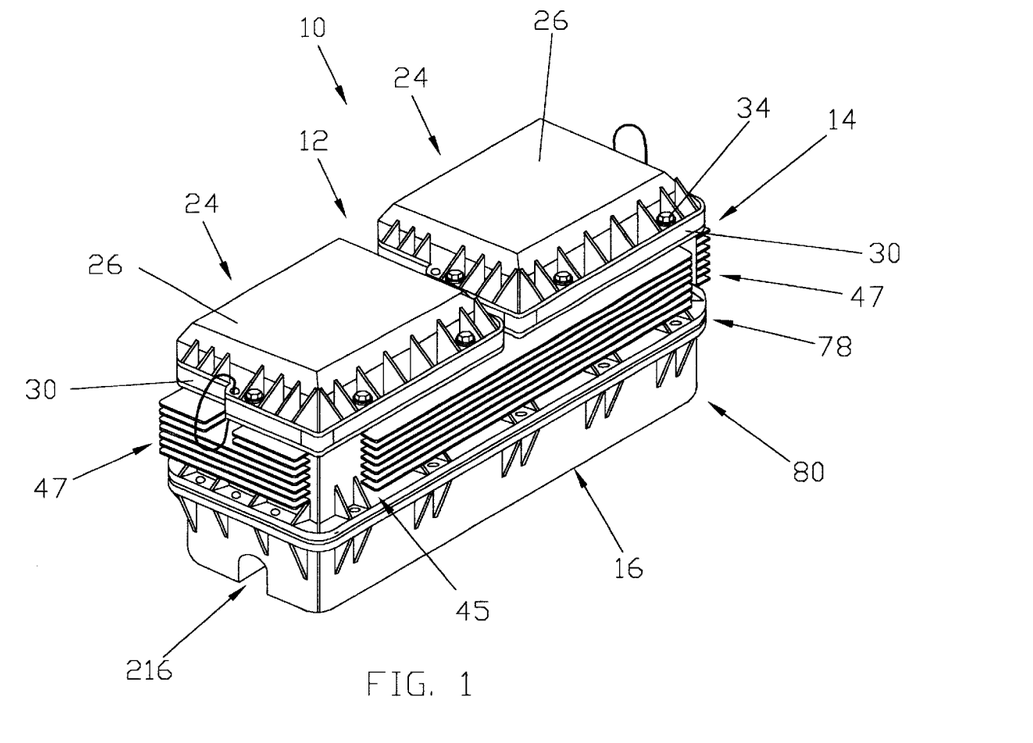
FIG. 1 is a perspective view of the protective pot or container of the present invention.
Figure 8:
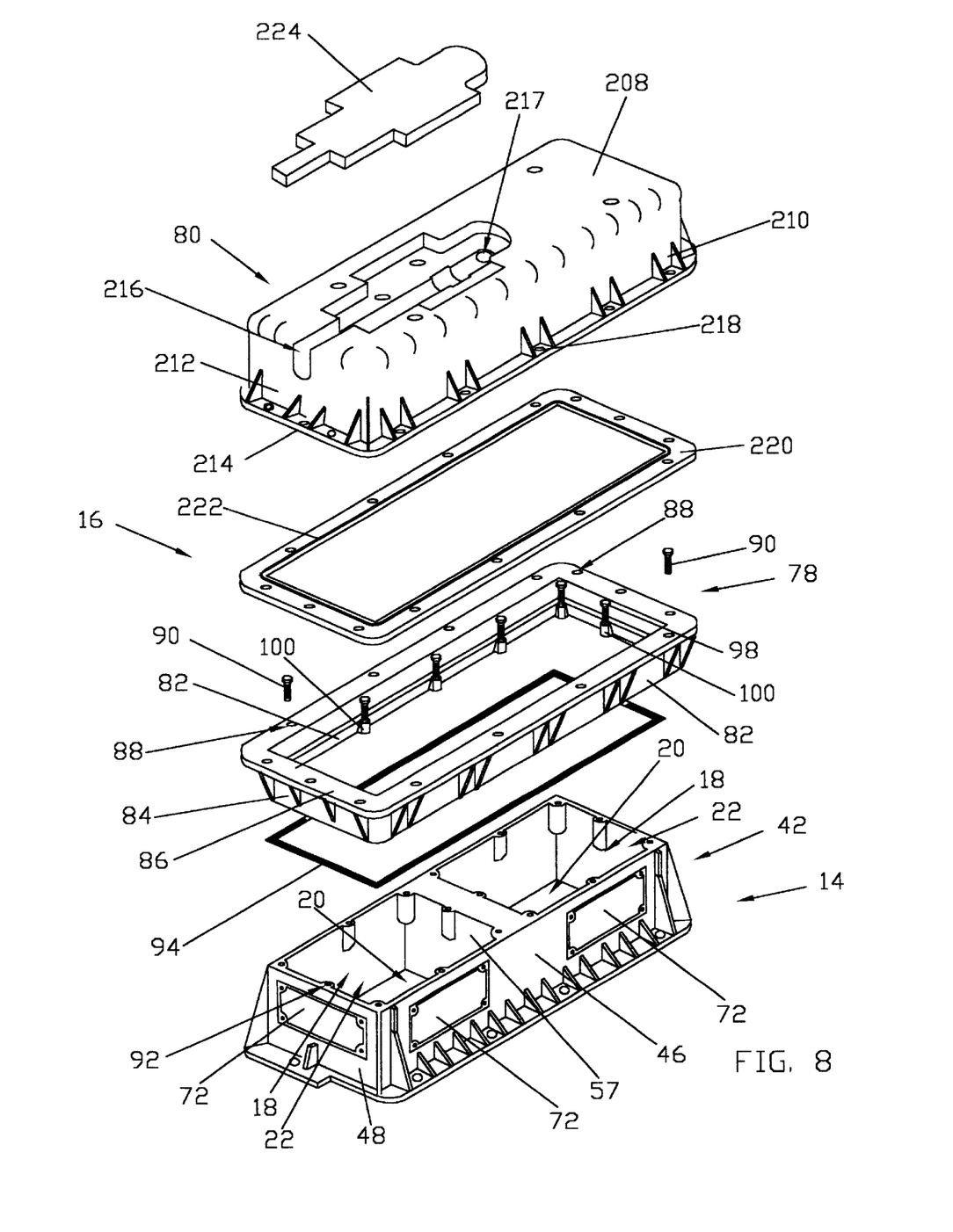
FIG. 8 is an exploded perspective bottom view of the intermediate housing assembly and partial base assembly of the protective pot or container of the present invention.

As best shown in FIG. 1, the present invention relates to a protective pot or container generally indicated as 10 to protect electronic components disposed therein from the environs and to dissipate heat generated by operation of the electronic components disposed therein into the environs. The protective pot or container 10 comprises a cover assembly, a housing assembly and a base assembly generally indicated as 12, 14, and 16 respectively to cooperatively form a pair of electronic component compartments each indicated as 18 including a top openings 20 and a bottom opening 22 (FIGS. 4 and 8).

Figure 2:
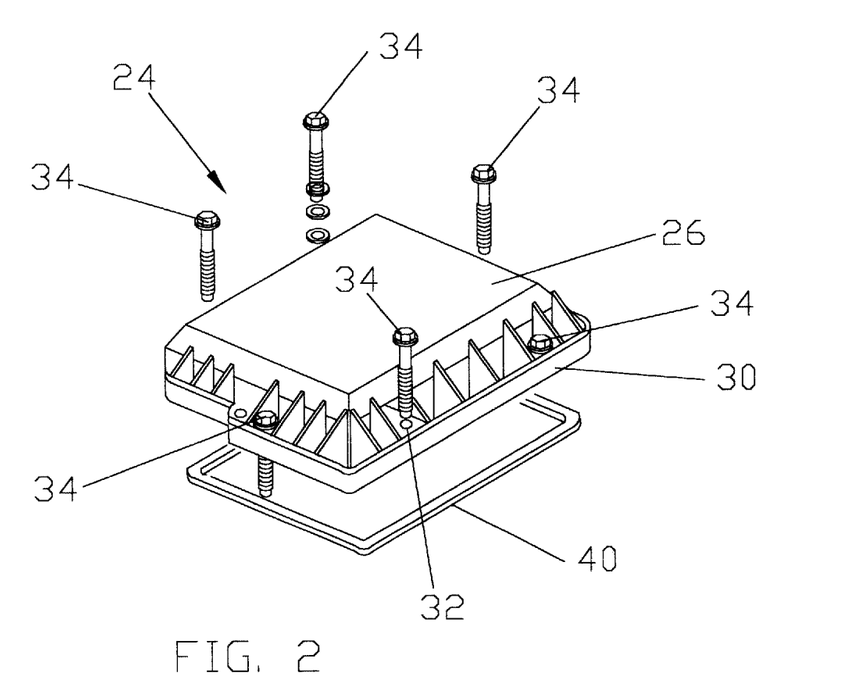
FIG. 2 is a perspective top view of a cover of the cover assembly of the protective pot or container of the present invention.
Figure 3:
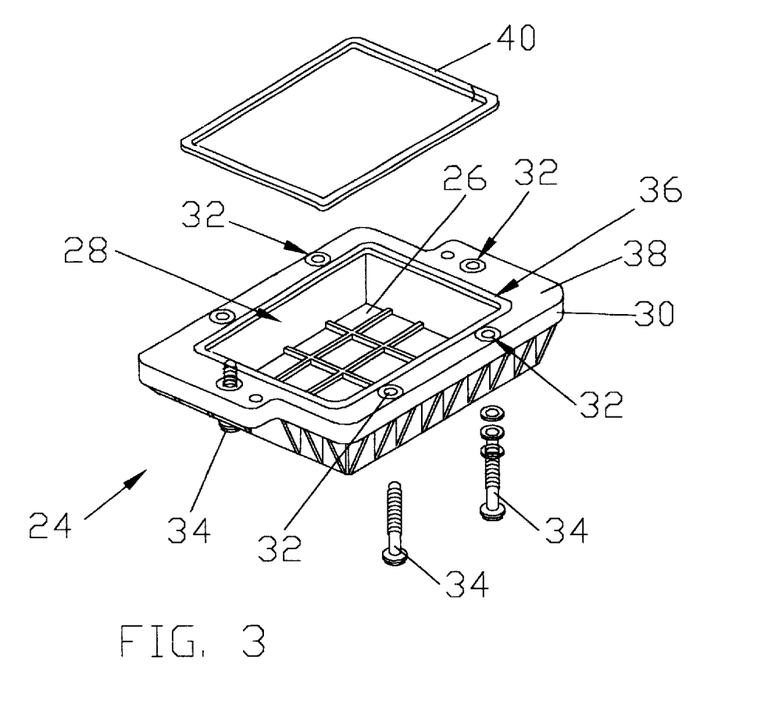
FIG. 3 is a perspective bottom view of a cover of the cover assembly of the protective pot or container of the present invention.

As shown in FIG. 1, the cover assembly 12 comprises a pair of covers each generally indicated as 24 to selectively close the corresponding top opening 20 when attached to or mounted on the housing assembly 14. As best shown in FIGS. 2 and 3, each cover 24 comprises a lid including a raised cap portion 26 having a cavity 28 with a lid mounting flange 30 including a plurality of fastener channels, apertures or slots each indicated as 32 formed therethrough to receive a corresponding bolt or other suitable fastener 34 to selectively secure the corresponding cover 24 to the housing assembly 14. A peripheral gasket recess or groove 36 is formed in the inner surface 38 of the lid mounting flange 30 to receive a lid sealing gasket 40 therein to seal the corresponding top opening 20 to close the top of the housing assembly 14 when the covers 14 are attached to or mounted thereon by the plurality of fasteners 34.

Figure 4:
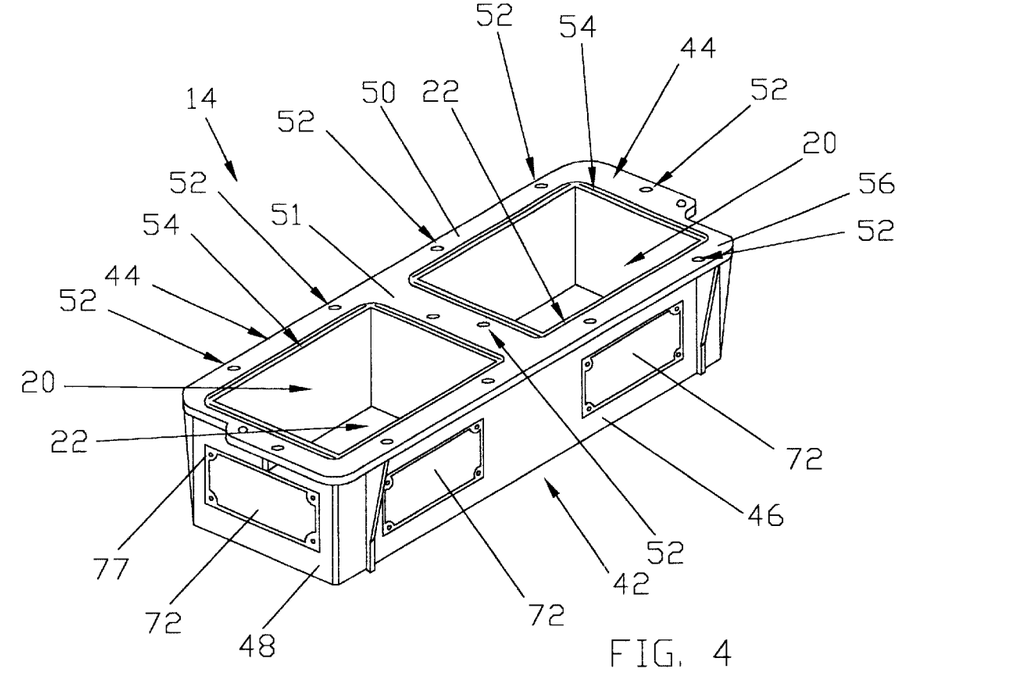
FIG. 4 is a perspective view of the intermediate housing assembly of the protective pot or container of the present invention.
Figure 5:
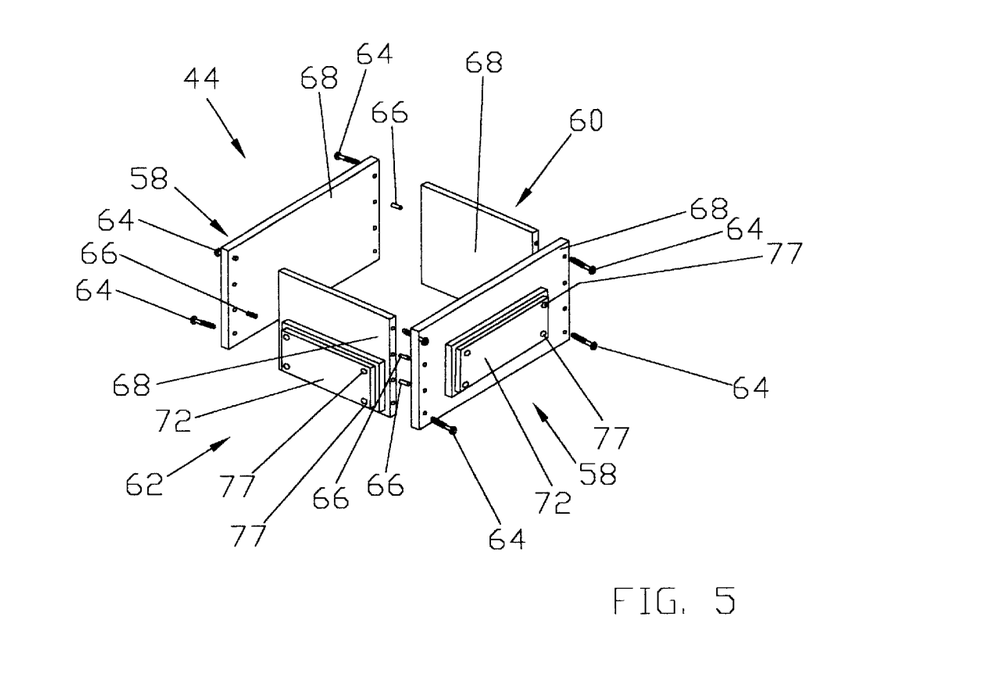
FIG. 5 is an exploded perspective view of an inner heat conductive sleeve of the intermediate housing assembly of the protective pot or container of the present invention.
Figure 6:
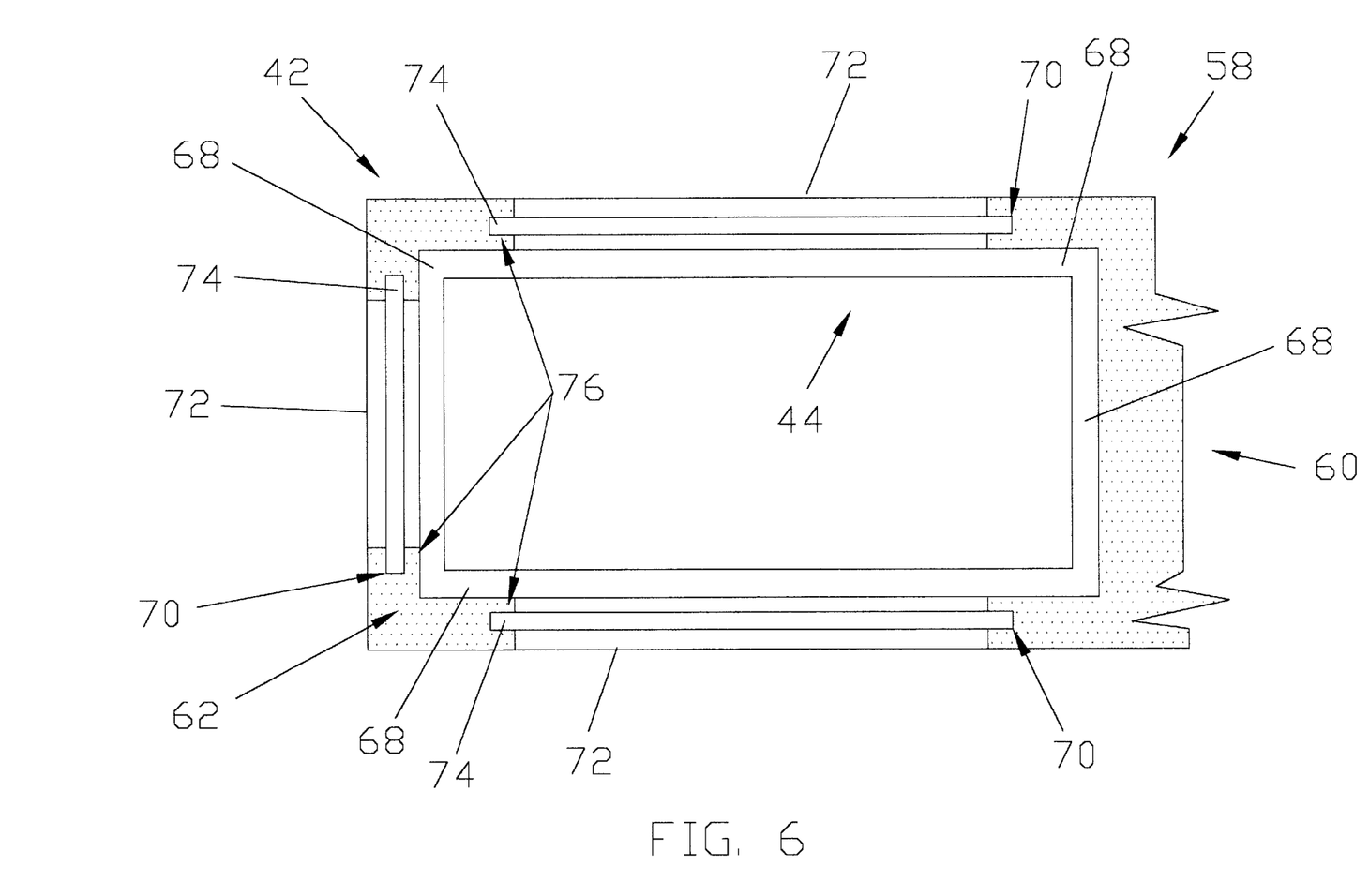
FIG. 6 is a cross-sectional top view of the intermediate housing of the protective pot or container of the present invention.

As shown in FIGS. 4 through 6, the housing assembly 14 comprising an outer protective housing frame generally indicated as 42 having a pair of inner heat conductive sleeves each generally indicated as 44 integrally formed therewith. As shown in FIG. 1, the side external heat sinks each generally indicated as 45 and the end external heat sinks each generally indicated as 47 are operatively mounted to opposite side walls and opposite end walls of the housing assembly 14 respectively as described more fully hereinafter.

As best shown in FIG. 4, the outer protective housing frame 42 comprises a pair of side walls each indicated as 46 and a pair of end walls each indicated as 48 having a peripheral mounting flange 50 formed about the periphery thereof and a cross mounting flange 51 extending between the mid portions of the sides of the peripheral mounting flange 50 to form the top openings 20 and including a plurality of fastener channels, apertures or slots each indicated as 52 formed therethrough to receive a corresponding bolt or other suitable fasteners 34 to selectively secure the covers 24 thereto. A peripheral gasket recess or groove 54 is formed in the inner surface 56 of the lid mounting flange 50 to receive the lid sealing gasket 40 therein to seal the cover assembly 12 with the housing assembly 14 when the covers 14 are attached to or mounted thereon by the plurality of fasteners 34. As shown in FIG. 8, a pair of cross members each indicated as 57 extends downwardly from the cross mounting flange 51 to cooperatively form the bottom openings 22 in combination with the corresponding end wall 48.

As best shown in FIG. 5, each inner heat conductive sleeve 44 comprises a pair of side members each generally indicated as 58, an inner end member generally indicated as 60 and an outer end member generally indicated as 62 connected or fastened together by a plurality of fasteners and pins each indicated as 64 and 66 respectively. The side members 58, the inner end member 60 and the outer end member 62 each comprises an inner heat conductive panel 68 of heat conductive material such as aluminum. An outer heat conductive thermal coupler generally indicated as 70 of heat conductive material such as aluminum form a portion of the side members 58 and the outer end member 62. The inner heat conductive sleeve 44 and the outer protective housing frame 42 are integrally formed by molding or pouring molten plastic or similar generally non-heat conductive material around the inner heat conductive sleeve 44 such that the inner heat conductive panels 68 are disposed in the interior of the outer protective housing frame 42 formed of the plastic or similar material and the outer heat conductive thermal coupler 70 extending through the side walls 46 and the outer end wall 48 to the outer exterior of the outer protective housing frame 42 exposing the outer surface 72 of outer heat conductive thermal coupler 70 to the environs.

As best shown in FIG. 6, the periphery of each outer heat conductive thermal coupler 70 includes a mechanical anchor comprising a peripheral ridge or protrusion 74 extending inwardly from the outer surface 72 of the outer heat conductive thermal coupler 70 substantially parallel to the corresponding inner conductive panel 68 and a groove or notch 76 to form an integrated housing assembly 14. In addition, an adhesive may be used to secure the outer protective housing frame 42 and the inner heat conductive sleeves 44 together. As described more fully hereinafter, the exposed outer surfaces 72 of the outer heat conductive thermal coupler 70 are disposed in heat exchange relationship with the external heat sinks 45 and 47. A plurality of internally threaded channels each indicated as 77 are formed in the outer heat conductive thermal coupler 70 to receive corresponding fasteners or bolts (not shown).

Figure 7:
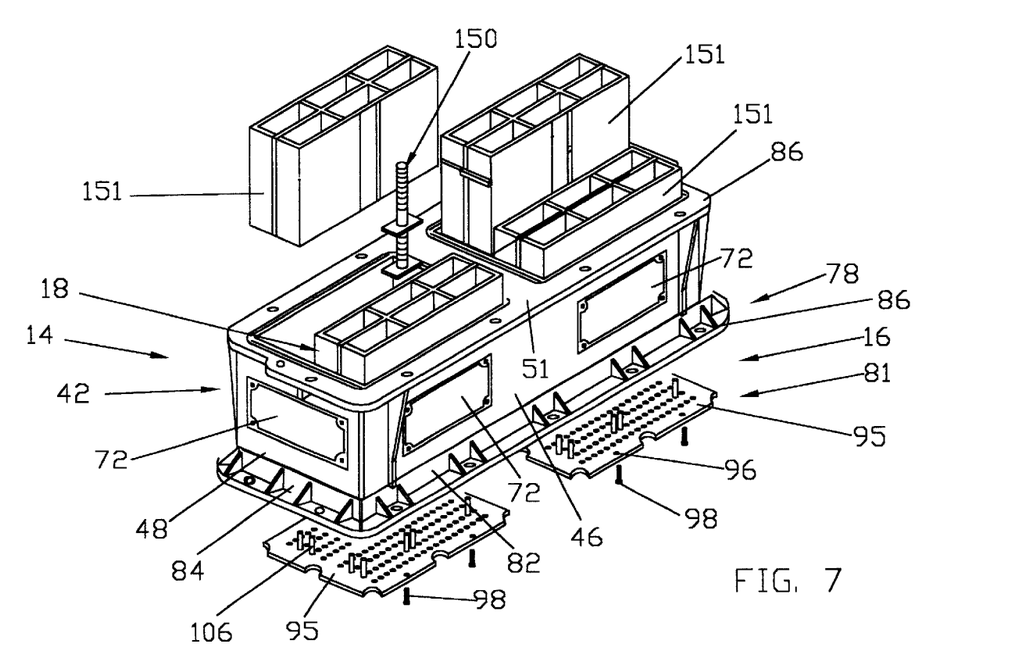
FIG. 7 is an exploded perspective top view of the intermediate housing assembly and partial base assembly of the protective pot or container of the present invention.
Figure 9:
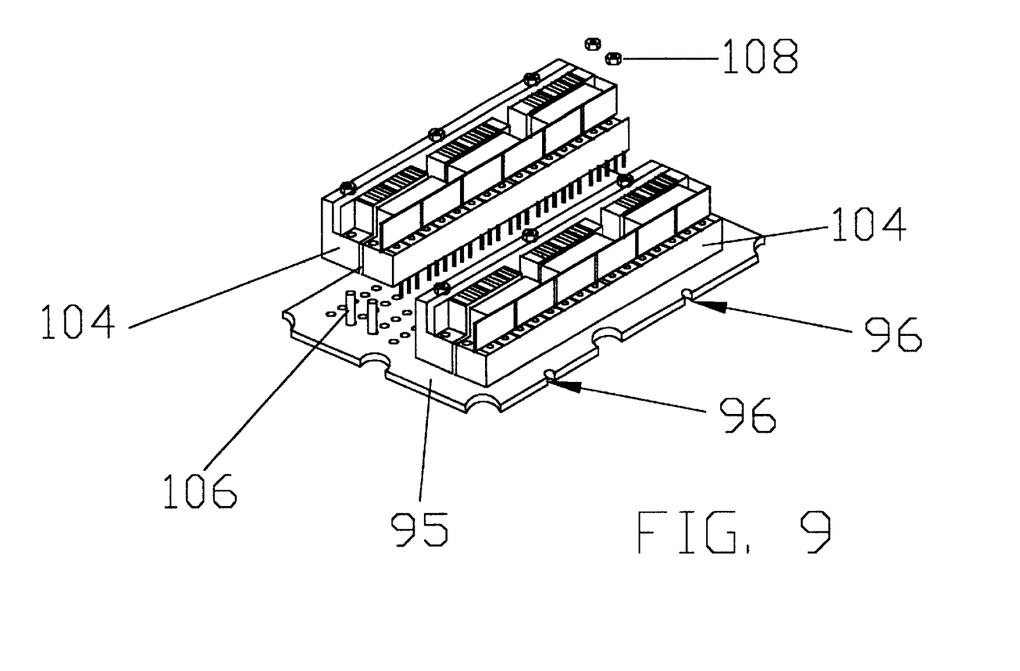
FIG. 9 is an exploded perspective view of the base plate with the component mounting codes of the back assembly of the present invention.

As best shown in FIGS. 7 and 8, the base assembly 16 comprises an inner base member generally indicated as 78 to secure or attach the base assembly 16 to the housing assembly 14 of the protectable pot or container 10 and an outer base cover generally indicated as 80 attached to or mounted on the inner base member 78 to selectively close the bottom of the housing assembly 14 and a pair of base plates each indicated as 81 in FIGS. 7 and 9 to support the electronic components thereon. The base member 78 comprises a pair of side members each indicated as 82 and a pair of end members each indicated 84 having a peripheral mounting flange 86 about the periphery thereof to form an open frame to receive and support the outer base cover 80. A plurality of fastener channels, apertures or slots each indicated as 88 are formed through the peripheral mounting flange 86 to receive a corresponding bolt or other suitable fastener 90 to selectively secure the inner base member 78 to a corresponding plurality of posts each indicated as 92 formed on the housing assembly 14. A peripheral gasket 94 seals the inner base member 78 to the housing assembly 14 when the base assembly 16 is attached to or mounted thereon by the plurality of fasteners 90.

As best shown in FIG. 8, the outer base cover 80 comprises a bottom wall 208, a pair of side walls or members each indicated as 210 and a pair of end walls or members each indicated as 212 having a peripheral mounting flange 214. A cable channel 216 and a cable aperture 217 are formed in the bottom wall 208 to house a cable (not shown) therein and to connect the cable (not shown) to the electronic components in the protective pot or container 10. A cover plate 224 may be used to close or cover the cable channel 216 and the cable aperture 218. A plurality of fastener channels, apertures or slots each indicated as 218 are formed through the peripheral mounting flange 214 to receive a corresponding bolt of other suitable fastener (not shown) to selectively secure the outer base cover 80 to the inner base member 78. A peripheral gasket 220 and a seal 222 may be used to seal the inner base member 78 to the outer base cover 80.

As best shown in FIGS. 7 and 9, each base plate 81 comprises a substantially flat base element 95 including a plurality of fastener channels, apertures or slots each indicated as 96 formed to receive a corresponding bolt or other suitable fastener 98 to secure each base plate 81 to a corresponding plurality of posts each indicated as 100 formed on the housing assembly 14.

Figure 10:
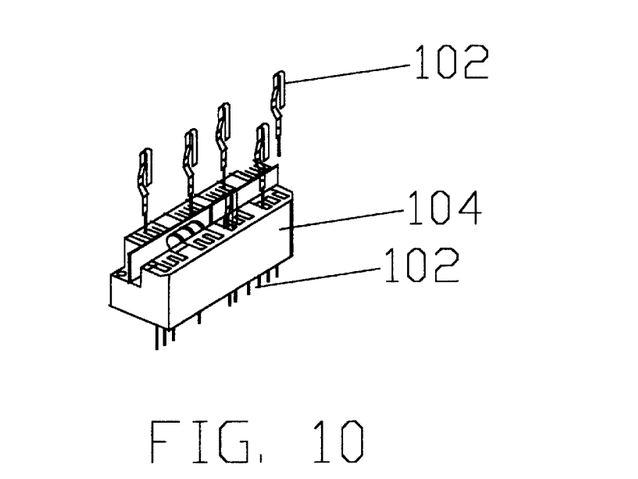
FIG. 10 is a perspective view of a component mounting block used with the present invention.

As shown in FIGS. 7, 9 and 10, a plurality of apertures or holes are formed through each base plate 81 to receive corresponding connector pins 102 operatively mounted on corresponding component mounting blocks 104 attached to corresponding base plate 81 by fasteners such as post 106 and nut 108 combinations.

Figure 11:
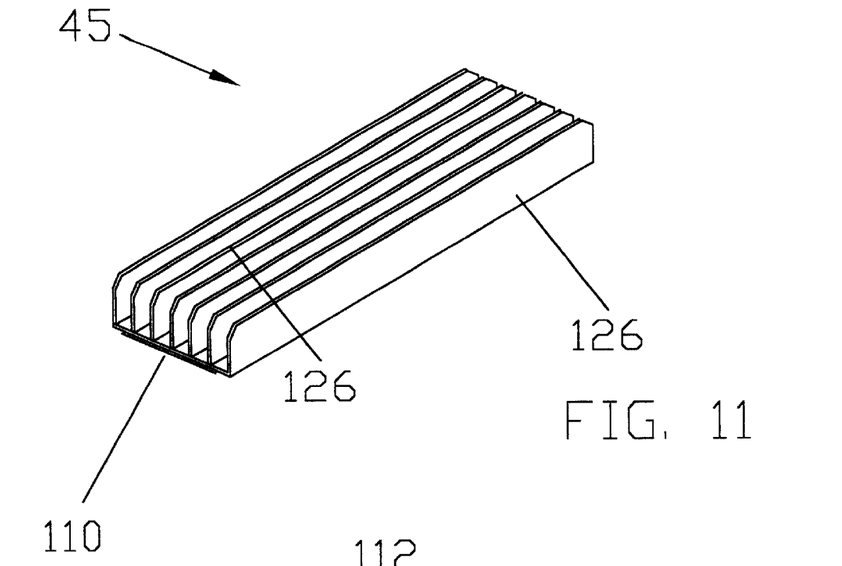
FIG. 11 is a perspective front view of the side heat sink of the present invention.
Figure 12:
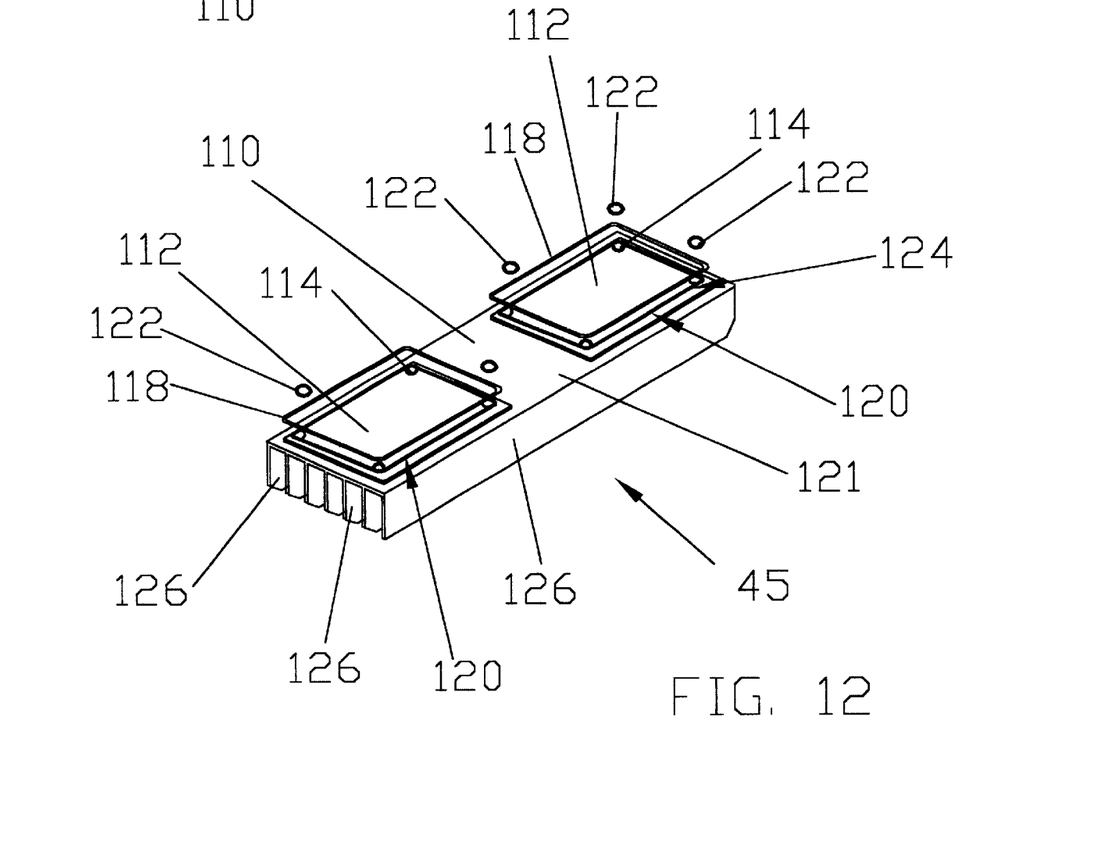
FIG. 12 is a perspective back view of the side heat sink of the present invention.

As best shown in FIGS. 11 and 12, each side external heat sink 45 constructed of thermally conductive material such as aluminum comprises a heat sink member 110 including a pair of substantially flat heat transfer surfaces each indicated as 112 held in heat transfer relationship with the corresponding outer heat conductive thermal coupler 70 by a plurality of fasteners such as bolts (not shown) extending through corresponding apertures 114 formed through the heat sink member 110 and the internally threaded or mounting channels or recesses 77 formed in the corresponding outer heat conductive thermal coupler 70 of the corresponding heat conductive panel 68. A plurality of heat sink fins or elements each indicated as 126 extend outwardly from the heat sink member 110 into the environs. A peripheral gasket recess or groove 120 is formed in the inner surface 121 of the heat sink member 110 to receive a heat sink sealing gasket 118 therein to seal the corresponding outer heat conductive thermal coupler 70 when the side external heat sinks 45 are attached to or mounted on housing assembly 14 by the plurality of fasteners. A plurality of O-rings each indicated as 122 may be used to seal the apertures 116.

Figure 13:
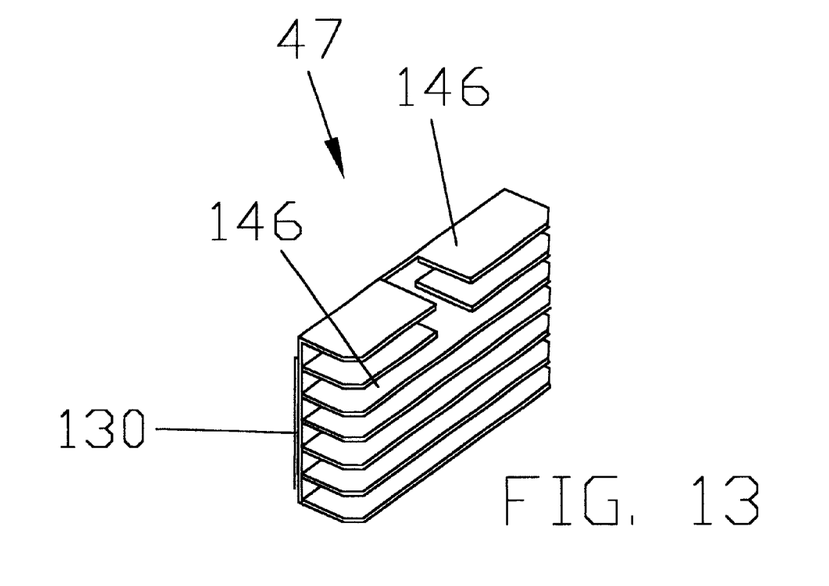
FIG. 13 is a perspective front view of the end heat sink of the present invention.
Figure 14:
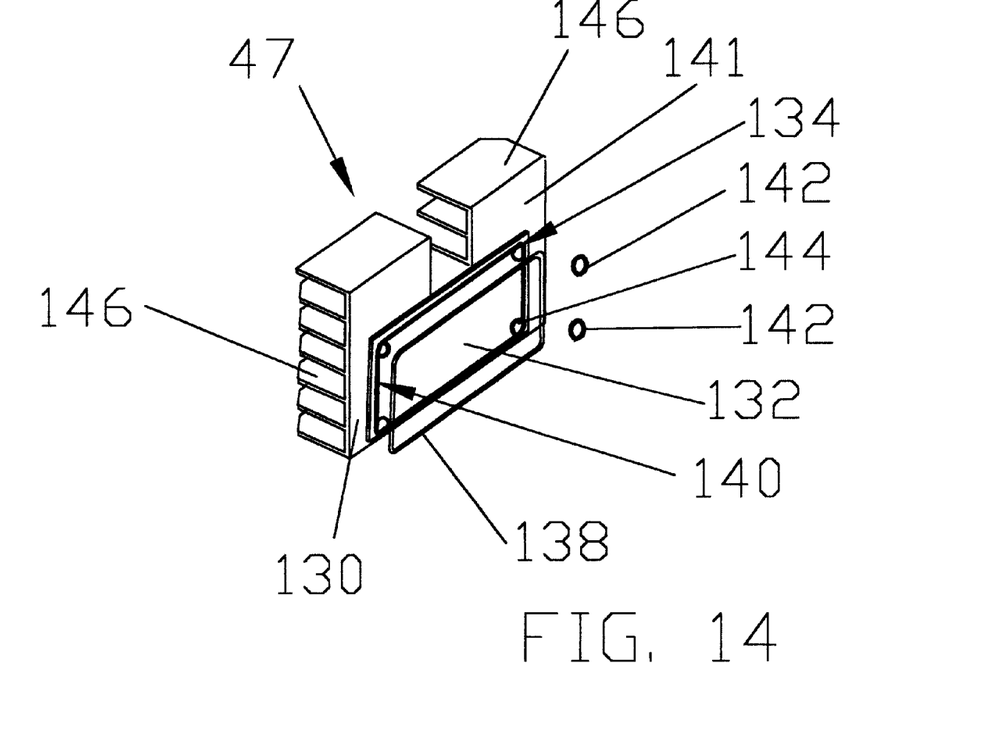
FIG. 14 is a perspective back view of the end heat sink of the present invention.

As best shown in FIGS. 13 and 14, each end external heat sink 47 constructed of thermally conductive material such as aluminum comprises a heat sink member 130 including a pair of substantially flat heat transfer surfaces each indicated as 132 held in heat transfer relationship with the corresponding outer heat conductive thermal coupler 70 by a plurality of fasteners such as bolts (not shown) extending through corresponding apertures 134 formed through the heat sink member 130 and internally threaded or mounting channels or recesses 77 formed in the corresponding outer heat conductive thermal coupler 70 of the corresponding heat conductive panel 68. A plurality of heat sink fins or elements each indicated as 146 extend outwardly from the heat sink member 130 into the environs. A peripheral gasket recess or groove 140 is formed in the inner surface 141 of the heat sink member 130 to receive a heat sink sealing gasket 138 therein to seal the corresponding outer heat conductive thermal coupler 70 when the end external heat sink 47 is attached to or mounted on housing assembly 14 by the plurality of fasteners. A plurality of O-rings each indicated as 142 may be used to seal the apertures 134.

Figure 15:
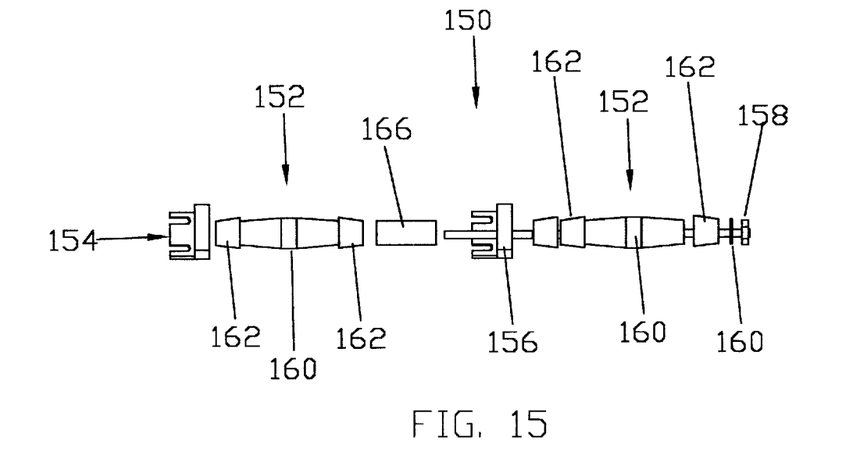
FIG. 15 is an exploded side view of the compression clamp of the present invention.

As shown in FIGS. 7 and 15, a compression clamp generally indicated as 150 secures a pair of electronic component cages or cartridges each indicated as 151 in each of the electronic compartments 18. The compression clamp 150 comprises a pair of compression spring assemblies each generally indicated as 152 operatively disposed between a compression spring drive 154 and a compression spring drive screw 158 and separated by a compression spring guide 156. Each compression spring guide 152 comprises a compression spring 160 disposed between a pair of compression spring caps each indicated as 162. A compression spring bushing 166 is disposed adjacent the compression spring guide 156.

Figure 16:
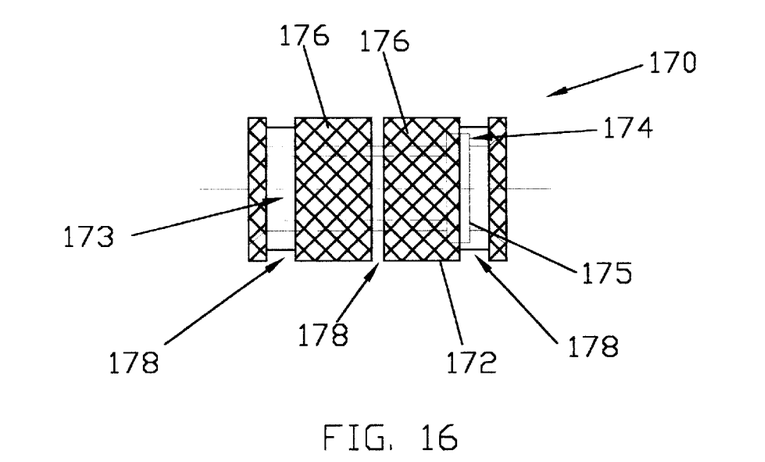
FIG. 16 is a side view of the anchoring insert of the present invention.
Figure 17:
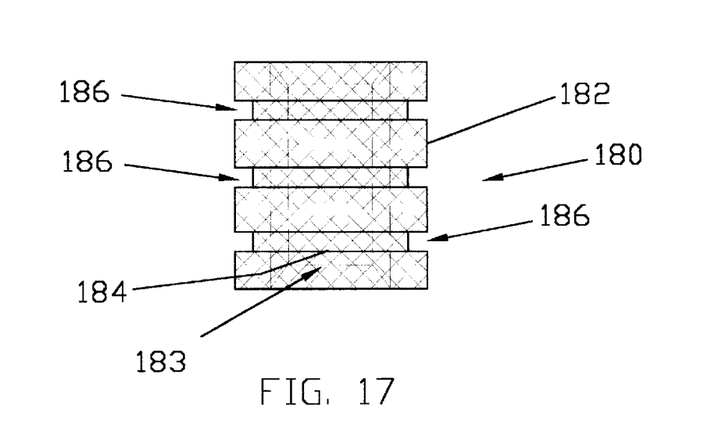
FIG. 17 is a side view of an alternate anchoring insert of the present invention.

FIGS. 16 and 17 show alternate embodiments of anchoring inserts 170 and 180 respectively that may be embedded in the housing assembly 14 and base assembly 16 to receive the various fasteners.

Specifically, the anchoring insert 170 comprises a body or member 172 having an internally threaded fastener receiving channel 173 formed therethrough having a retention ring recess 174 formed at one end portion thereof to receive a retention ring 175 therein and external knurls 176 and a plurality of anchoring grooves each indicated as 178 formed on the exterior thereof as shown in FIG. 16.

As shown in FIG. 17, the alternative anchoring insert 180 comprises a body or member 182 having an internal threaded fastener receiving channel 183 formed therethrough with external knurls 184 and a plurality of anchoring grooves 186 formed on the exterior thereof.

Thus, when the protective pot or container 10 is fully assembled, heat generated by the electronic components disposed therein is transferred to the inner heat conductive panels 68 and through the corresponding outer heat conductive thermal coupler 70 to the corresponding external heat sinks 45 and 47 and dissipated into the environs.

It will thus be seen that the objects set forth above, among those made apparent from the preceding description are efficiently attained and since certain changes may be made in the above construction without departing from the scope of the invention, it is intended that all matter contained in the above description or shown in the accompanying drawing shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Now that the invention has been described,

What is claimed is:

1. A protective pot or container to protect electronic components disposed therein and to dissipate heat generated by operation of the electronic components comprising a cover assembly, a housing assembly and a base assembly to cooperatively form at least one electronic component compartment including a top opening and a bottom opening to operatively house the electronic components therein wherein said cover assembly comprises a lid removably attached to the housing assembly to selectively close the top opening, said housing assembly comprises an outer protective housing frame having a inner heat conductive sleeve partially disposed therein to absorb heat from the electronic components and at least one external heat sink in heat transfer relationship with said inner heat conductive sleeve to receive heat therefrom and to dissipate the heat into the surrounding environs and said base assembly comprising a base member to selectively close the bottom opening.

2. The protective pot or container of claim 1 wherein said inner heat conductive sleeve comprises at least one inner heat conductive panel having an outer heat conductive thermal coupler of heat conductive material in heat transfer relationship therewith.

3. The protective pot or container of claim 2 wherein the periphery of said outer heat conductive thermal coupler includes a mechanical anchor to secure said inner conductive sleeve to said outer protective housing frame.

4. The protective pot or container of claim 3 wherein said mechanical anchor comprises a peripheral protrusion extending inwardly from the outer surface of said outer heat conductive thermal coupler to form a notch between said peripheral protrusion and said inner heat conductive panel.

5. The protective pot or container of claim 1 wherein said inner heat conductive sleeve comprises a pair of side members, an inner end member and an outer end member connected together, said side members and said inner end member and said outer end member each comprises an inner heat conductive panel, and an outer heat conductive thermal coupler forming a portion of said side members and said outer end member.

6. The protective pot or container of claim 5 wherein said inner heat conductive sleeve and said outer protective housing frame are integrally formed by molding a non-heat conductive material around said inner heat conductive sleeve such that said inner heat conductive panels are disposed in the interior of said outer protective housing frame and said outer conductive thermal coupler extends through said side walls and said outer end wall of said outer protective housing frame exposing the outer surface of said outer heat conductive thermal coupler to the environs.

7. The protective pot or container of claim 6 wherein the periphery of each said outer heat conductive thermal coupler includes a mechanical anchor comprising a peripheral protrusion extending inwardly from the outer surface of said outer heat conductive thermal coupler to form a notch between said peripheral protrusion and said inner heat conductive panel.

8. The protective pot or container of claim 1 wherein said base assembly comprises an inner base member to secure said base assembly to said housing assembly and an outer base cover mounted on said inner base member to selectively close the bottom of said housing assembly.

9. The protective pot or container of claim 8 wherein said outer base cover comprises a bottom wall, a pair of side walls and a pair of end walls wherein a cable channel and a cable aperture are formed in said bottom wall to house a cable therein and to connect the cable to the electronic components in said protective port or container.

10. The protective pot or container of claim 9 further including a peripheral gasket having a seal on both sides thereof disposed between said inner base member and said outer base cover to form a seal therebetween.

11. The protective pot or container of claim 9 further including a cover plate to selectively cover said cable channel and said cable.

12. The protective pot or container of claim 8 further including a base plate to support the electronic components thereon.

13. The protective pot or container of claim 12 wherein said base plate comprises a substantially flat base element to receive connector pins operatively mounted on corresponding component mounting blocks.

14. The protective pot or container of claim 1 further including an anchoring insert comprising a member having an internally threaded fastener receiving channel formed therethrough having a retention ring recess formed at one end portion thereof to receive a retention ring to receive fasteners to secure said housing assembly to said base assembly.

15. The protective pot or container of claim 14 wherein said anchoring insert includes at least one anchoring groove formed on the exterior thereof.

16. The protective pot or container of claim 1 further including an anchoring insert comprises a member having an internal threaded fastener receiving channel formed therethrough and at least one anchoring groove formed on the exterior thereof.

17. The protective pot or container of claim 16 wherein said anchoring insert further includes external knurls.

18. The protective pot or container of claim 1 wherein said external heat sink comprises a heat sink member includes at least one substantially flat heat transfer surface held in heat transfer relationship with said outer heat conductive thermal coupler.

19. The protective pot or container of claim 18 further includes a peripheral gasket groove formed in the inner surface of said heat sink member to receive a heat sink sealing gasket therein to seal said outer heat conductive thermal coupler and said external heat sink.

20. The protective pot or container of claim 18 wherein said external heat sink includes a plurality of heat sink fins or elements extend outwardly from said heat sink member into the environs.

* * * * *